US009130091B2

(12) United States Patent
Keenihan et al.

(10) Patent No.: US 9,130,091 B2
(45) Date of Patent: Sep. 8, 2015

(54) PHOTOVOLTAIC BUILDING SHEATHING ELEMENT WITH ANTI-SLIDE FEATURES

(75) Inventors: James R. Keenihan, Midland, MI (US); Joseph A Langmaid, Caro, MI (US); Leonardo C Lopez, Midland, MI (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 0 days.

(21) Appl. No.: 14/004,499

(22) PCT Filed: Mar. 22, 2012

(86) PCT No.: PCT/US2012/030026
§ 371 (c)(1),
(2), (4) Date: Sep. 11, 2013

(87) PCT Pub. No.: WO2012/129355
PCT Pub. Date: Sep. 27, 2012

(65) Prior Publication Data
US 2014/0000676 A1    Jan. 2, 2014

Related U.S. Application Data

(60) Provisional application No. 61/466,241, filed on Mar. 22, 2011.

(51) Int. Cl.
*H01L 31/0203* (2014.01)
*H01L 31/048* (2014.01)
*H02S 20/25* (2014.01)

(52) U.S. Cl.
CPC ............ *H01L 31/0483* (2013.01); *H02S 20/25* (2014.12); *Y02B 10/12* (2013.01)

(58) Field of Classification Search
CPC ............ H01L 31/0422; H01L 31/0428; H01L 31/0483

USPC ............................................ 136/251; 438/64
See application file for complete search history.

(56) References Cited

U.S. PATENT DOCUMENTS 3,767,471 A    10/1973    Kasper et al.
4,040,867 A     8/1977    Forestieri et al.
(Continued)

FOREIGN PATENT DOCUMENTS

CN    101828268 A    9/2010
EP       841706 A2    5/1998
(Continued)

OTHER PUBLICATIONS

Written Opinion of the International Preliminary Examining authority dated Oct. 10, 2013 international application No. PCT/US2012/030026.

(Continued)

*Primary Examiner* — Jayne Mershon
(74) *Attorney, Agent, or Firm* — The Dobrusin Law Firm, P.C.

(57) ABSTRACT

The present invention is premised' upon an assembly that includes at least a photovoltaic building sheathing element capable of being affixed on a building structure, the photovoltaic building sheathing element. The element including a photovoltaic cell assembly, a body portion attached to one or more portions of the photovoltaic cell assembly; and at feast a first and a second connector assembly capable of directly or indirectly electrically connecting the photovoltaic cell assembly to one or more adjoining devices; wherein the body portion includes one or more geometric features adapted to engage a vertically adjoining device before installation.

19 Claims, 6 Drawing Sheets

(56) References Cited

U.S. PATENT DOCUMENTS

| | | | |
|---|---|---|---|
| 4,465,575 A | 8/1984 | Love et al. | |
| 2004/0206035 A1 | 10/2004 | Kandalgaonkar | |
| 2005/0001150 A1 | 1/2005 | Yonemura | |
| 2006/0064039 A1* | 3/2006 | Griego et al. | 600/587 |
| 2006/0201699 A1* | 9/2006 | Burdy et al. | 174/135 |
| 2007/0193618 A1 | 8/2007 | Bressler et al. | |
| 2007/0256734 A1 | 11/2007 | Guha et al. | |
| 2008/0302030 A1* | 12/2008 | Stancel et al. | 52/173.3 |
| 2010/0229923 A1* | 9/2010 | Frolov et al. | 136/251 |

FOREIGN PATENT DOCUMENTS

| | | | |
|---|---|---|---|
| EP | 1032051 A2 | 9/1999 | |
| EP | 1071137 A2 | 7/2000 | |
| EP | 2216829 A1 | 8/2013 | |
| JP | 2216874 A | 2/1989 | |
| JP | 2143468 A | 6/1990 | |
| JP | 292907 A | 11/1995 | |
| JP | 10189924 A | 7/1998 | |
| JP | 2000/226908 | 8/2000 | |
| JP | 2007-3000086 | 11/2007 | |
| JP | 2009-239146 | 10/2009 | |
| WO | 98/36139 A1 | 8/1998 | |
| WO | 2008/073905 | 6/2008 | |
| WO | 2008/073905 A2 | 6/2008 | |
| WO | WO 2008/073905 | * | 6/2008 |
| WO | 2009/137348 A2 | 11/2009 | |
| WO | 2010/144226 A1 | 12/2010 | |
| WO | 2010/151777 A2 | 12/2010 | |

OTHER PUBLICATIONS

Japanese Office action for Japanese application No. 2014-501222; dated Jul. 15, 2014.

International Search Report dated May 10, 2013 (PCT/US2012/1030026).

The Patent Office of the People's Republic of China Notification of First Office Action dated May 28, 2015 for Application No. 201280014487.8.

* cited by examiner

PHOTOVOLTAIC BUILDING SHEATHING ELEMENT WITH ANTI-SLIDE FEATURES

CLAIM OF PRIORITY

This application is a national phase filing under 35 USC §371 from PCT Application serial number PCT/US2012/030026 filed on 22 Mar. 2012, and claims priority therefrom. This application further claims priority from U.S. Provisional Application 61/466,241 filed 22 Mar. 2011 both incorporated herein by reference in their entirety.

This invention was made with U.S. Government support under contract DE-FC38-07G017054 awarded by the Department of Energy. The U.S. Government has certain rights in this invention.

FIELD OF THE INVENTION

The present invention relates to an improved photovoltaic roofing or building sheathing element capable of being affixed on a building structure, the roofing or building sheathing element including at least: a photovoltaic cell assembly in the form of a panel, a body portion attached to one or more portions of the photovoltaic cell assembly, at least a first and a second connector assembly disposed on opposing sides of the photovoltaic sheathing element, wherein the body portion includes one or more geometric features adapted to engage a vertically adjoining device before installation.

BACKGROUND

Efforts to improve photovoltaic (PV) devices, particularly those devices that are integrated into building structures (e.g. photovoltaic sheathing elements, spacer pieces, edge pieces), to be used successfully, should satisfy a number of criteria. The PV device and the array as installed should be durable (e.g. long lasting, sealed against moisture and other environmental conditions) and protected from mechanical abuse over the desired lifetime of the product, preferably at least 10 years, more preferably at least 25 years. The device should be easily installed into the array of devices (e.g. installation similar to conventional roofing shingles or exterior wall coverings) or replaced (e.g. if damaged). It also, should be designed to prevent, as much as possible, water from getting under the device and to the building surface that the device is affixed to.

To make this full package desirable to the consumer, and to gain wide acceptance in the marketplace, the system should be inexpensive to build and install. This may help facilitate lower generated cost of energy, making PV technology more competitive relative to other means of generating electricity.

Existing art systems for PV devices may allow for the device to be directly mounted to the building structure or they may fasten the devices to battens, channels or "rails" ("stand-offs") above the building exterior (e.g. roof deck or exterior cladding). These systems may be complicated, typically do not install like conventional cladding materials (e.g. roofing shingles or siding) and, as a consequence, may be expensive to install. Also, they may not be visually appealing as they do not look like conventional building materials. "Stand-offs" to mount PV device every 2-4 feet may be required. Thus, installation cost can be as much or more than the cost of the article. They also may suffer from issues related to environmental conditions such as warping, fading and degradation of its physical properties.

It is believed that most standard roofing shingles used today are constructed with asphalt cement. This may contain mineral granules and fiberglass matt, but the modulus is suitably low, so as to allow conformity to irregularities on the roof. This material is also designed to allow for bonding between layers of shingles so as to resist wind and weather from penetrating the layers. They offer a high friction surface between their primary materials of construction and the adhesive strips that may be located on the back side.

In developing new shingles or slates with higher durability the materials of construction will change. Specifically in the case of solar shingles, the standard asphalt based materials are not suitable, it may be desirable to construct the shingles, slates, tiles, or solar devices with a polymeric material such as a polyolefin with or without inorganic fillers. This material is low cost, resistant to moisture damage, and may be designed for a multitude of physical properties and colors. Several problems may arise when using these materials due to their low coefficient of friction and ability to be repaired or modified on the roof.

The specific problem of low coefficient of friction may be exacerbated when the roof becomes high pitch (greater than 3:12) and when solar devices are integrated. In these cases, the shingles may slide off the roof during installation if the installer does not take extra caution. This is unlike a standard asphalt shingle that will tack and conform to other sheathing elements and fend to stay in place during installation. The cost, weight, and fragile nature of a solar roofing product may make this problem more critical. Because the solar roofing product may contain fragile materials, such as glass, solar ceils, and electrical connectors, it would most likely be destroyed if it was to slide off the roof. These same materials may also result in higher weights and greater size, making them more difficult to hold on the roof prior to installing.

When high contents of mineral fillers or non-elastomeric polymers are used on the roofing product, it may also be desirable to create a pre-bend in the part, so the bottom edge is forced into the roof deck upon nailing to aid in wind resistance and water sealing. This may make holding the roofing product in its location properly more difficult due to not contacting the roof at the critical nailing point until a nailing force is applied. This can result in the shingle drifting off its desired location until fully nailed in position.

Among the literature that can pertain to this technology include the following patent documents: US20040206035A1; WO2010151777A2; WO2010144226A1; EP2216829A1; and WO1998036139A1, all incorporated herein by reference for all purposes.

SUMMARY OF THE INVENTION

The present invention is directed to a photovoltaic (PV) device, and particularly to an improved photovoltaic sheathing element, for instance a photovoltaic shingle, that is affixed directly to a building structure (e.g. without the use of battens, channels or "rails" ("stand-offs")) above the building exterior) and used in an array of a plurality (two or more) of photovoltaic sheathing elements, and potentially other devices, that addresses at least one or more of the issues described in the above paragraphs. It is contemplated that the improved sheathing element includes at least a photovoltaic cell assembly; a body portion attached one or more portions of the photovoltaic cell assembly; at least a first and a second connector assembly disposed on opposing sides of the sheathing element and capable of directly or indirectly electrically connecting the photovoltaic cell assembly to at least two adjoining devices that are affixed to the building structure and wherein the body portion includes one or more geometric features adapted to engage a vertically adjoining device before installation.

DETAILED DESCRIPTION OF THE PREFERRED EMBODIMENT

Figure 1:
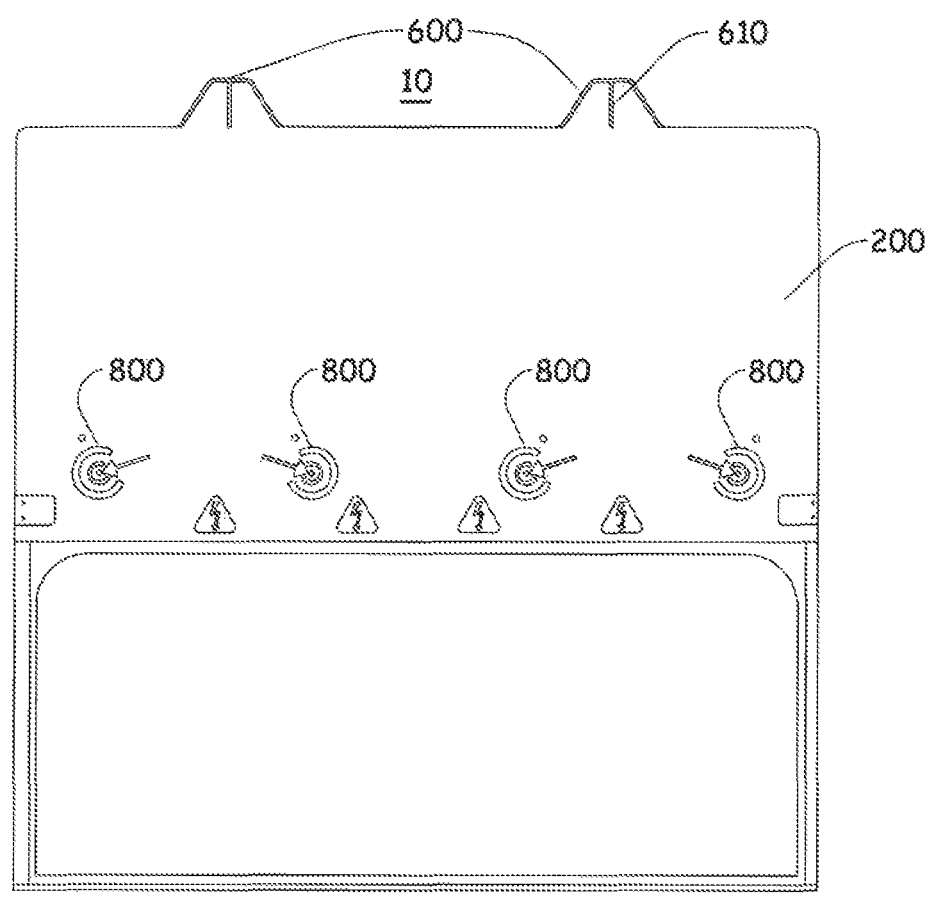
FIG. 1 is a plan view of an example of an improved photovoltaic device according to the present invention.
Figure 3:
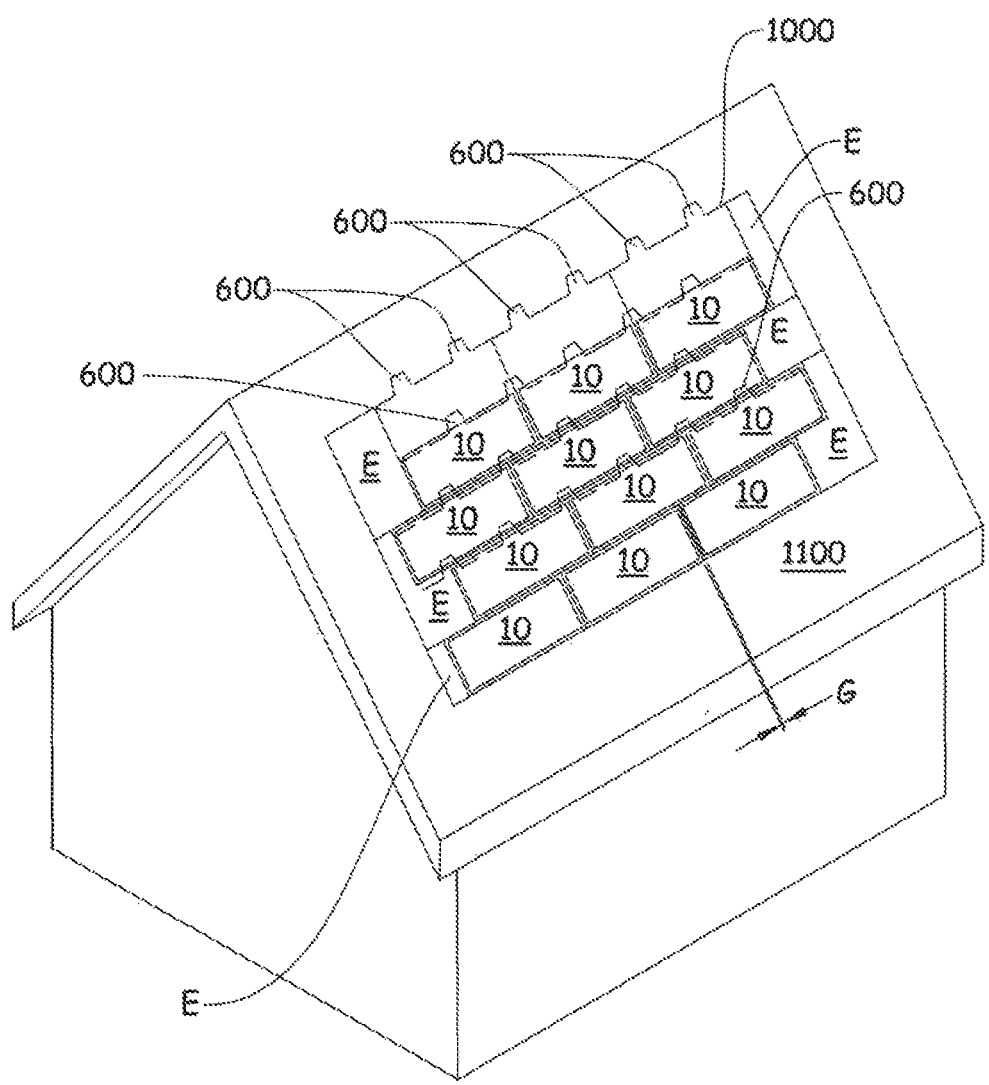
FIG. 3 is a of an exemplary array disposed on a building structure.
Figure 4:
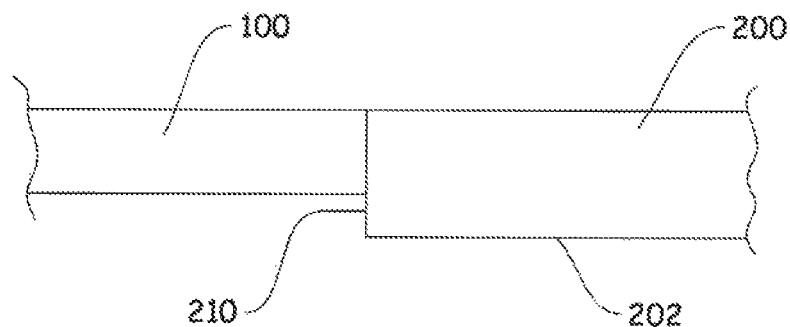
FIG. 4 is a sectional side view of an example of an improved photovoltaic device according to the present invention.

The present invention relates to an improved photovoltaic sheathing element 10 (hereafter "PV sheathing element"), as illustrated in FIG. 1, can be described generally as an assembly of a number of components and component assemblies that function to provide electrical energy when subjected to solar radiation (e.g. sunlight). Of particular interest and the main focus of the present disclosure is an improved PV sheathing element 10 that includes at least a photovoltaic cell assembly 100 joined to a body portion 200 that includes one or more connector assemblies 300 and wherein the body portion further includes one or more geometric features adapted to engage a vertically adjoining device before installation. In a preferred embodiment, the PV sheathing element is formed by taking the photovoltaic cell assembly (and potentially other components and assemblies such as connector components) and forming (e.g. via injection molding) the body portion about at least portions the photovoltaic cell assembly. It is contemplated that the relationships (e.g. at least the geometric properties and/or the material properties) between the components and component assemblies (of the PV sheathing element 10) and surrounding devices are surprisingly important in solving one or more of the issues discussed in the background section above. Of particular interest in this invention is where the PV sheathing element 10 is utilized for what is commonly known as Building-Integrated Photovoltaics, or BIPV and wherein the PV sheathing element 10 is connected to other devices (PV sheathing elements 10 or otherwise) to form an array 1000, for example an array 1000 as illustrated in FIG. 3. Each of the components and component assemblies and their relationships are disclosed in greater detail and specificity in the following paragraphs.

Accordingly, pursuant to one aspect of the present invention, there is contemplated an assembly comprising: a photovoltaic building sheathing element capable of being affixed on a building structure, the photovoltaic building sheathing element comprising: a photovoltaic cell assembly, a body portion attached to one or more portions of the photovoltaic cell assembly; and at least a first and a second connector assembly capable of directly or indirectly electrically connecting the photovoltaic cell assembly to one or more adjoining devices; wherein the body portion includes one or more geometric features adapted to engage a vertically adjoining device before installation.

Accordingly, pursuant to another aspect of the present invention, there is contemplated an array of assemblies composing: At least two or more adjoining photovoltaic building sheathing elements capable of being affixed on a building structure forming the array of assemblies, each of the photovoltaic building sheathing elements comprising: a photovoltaic cell assembly, a body portion attached to one or more portions of the photovoltaic cell assembly; and at least a first and a second connector assembly disposed on opposing sides of the photovoltaic building element and capable of directly or indirectly electrically connecting the photovoltaic cell assembly to one or more horizontally adjoining devices; wherein the body portion includes one or more geometric features adapted to engage a vertically adjoining device before installation The invention may be further characterized by one or any combination of the features described herein, such as the photovoltaic building sheathing element includes a pre-bend, the pre-bend including a vertical bend distance of 3 to 35 mm as measured under a fixation area and normal to the building structure; the geometric feature comprises one or more extended ledge ribs disposed on an underside of the photovoltaic building element, the extended ledge ribs capable of engaging a top peripheral edge of vertically adjoining device; the geometric feature comprises one or more top peripheral tabs, the tabs including an upwardly extending portion; the upwardly extending portion begins 10 mm or greater from a distal end of the one or more top peripheral tabs and has an angle of about 5 to about 80 degrees relative to a plane defined by a mounting surface of the building structure; the upwardly extending portion extends from an upper surface of the one or more top peripheral tabs; the upwardly extending portion is capable of being flattened out with the exertion of a force of about 7 Newtons or greater applied normal to a distal end of the upwardly extending portion; the extended ledge rib is capable of being flattened out with the exertion of a force of about 7 Newtons or greater applied normal to a distal end of the extended ledge rib; the at least first and second connector assemblies are disposed on opposite sides of the photovoltaic building sheathing element and are capable of directly or indirectly electrically connecting the photovoltaic cell assembly to one or more horizontally adjoining devices It should be appreciated that the above referenced aspects and examples are non-limiting, as others exist within the present invention, as shown and described herein.

Photovoltaic Cell Assembly 100

Figure 2:
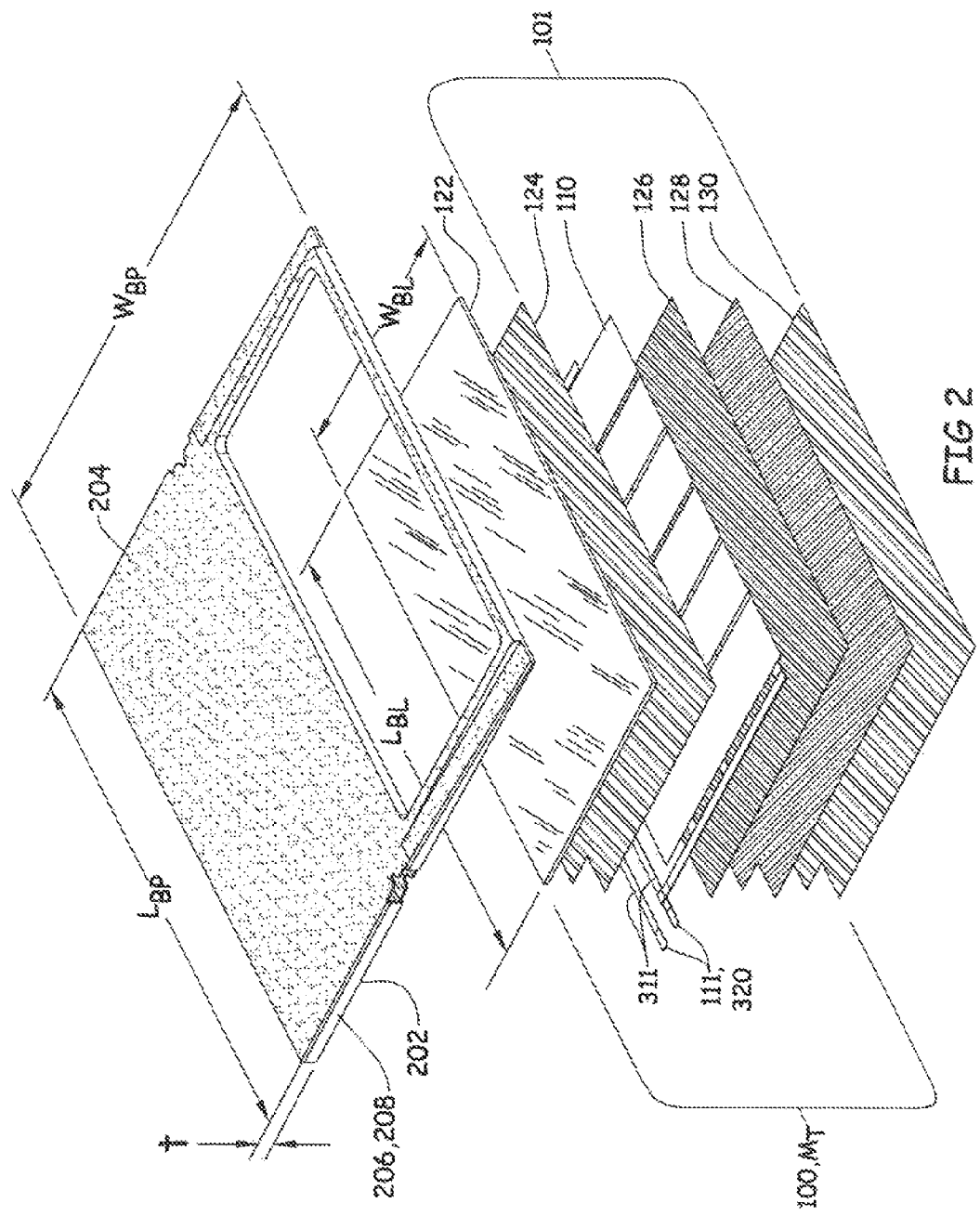
FIG. 2 is an exploded perspective view of an example of an improved photovoltaic device according to the present invention.

It is contemplated that the photovoltaic cell assembly 100 may be a compilation of numerous layers and components/assemblies, for example as disclosed in currently pending International patent application No. PCT/US09/042496, incorporated herein by reference. The photovoltaic cell assembly contains at least a barrier layer 122 and a photovoltaic cell layer 110 (generally located inboard of the peripheral edge of the barrier layer 122). It is contemplated that the photovoltaic cell assembly 100 may also contain other layers, such as encapsulant layers and other protective layers. Illustrative examples are shown in the figures and are discussed below. Exploded views of exemplary photovoltaic cell assemblies 100 are shown in FIG. 2. It is contemplated that the overall photovoltaic cell assembly 100 thickness $M_T$ may be about 1 to 12 mm, preferably about 2 to 9 mm, and most preferably less than about 9.0 mm.

Functionally, these encapsulant layers and other protective layers may include a number of distinct layers that each serve to protect and/or connect the photovoltaic cell assembly 100 together. Each preferred layer is described in further detail below, moving from the "top" (e.g. the layer most exposed to the elements) to the "bottom" (e.g. the layer most closely contacting the building or structure). In general each preferred layer or sheet may be a single layer or may itself comprise sub layers.

Barrier Layer 122

The barrier layer 122 may function as an environmental shield for the photovoltaic cell assembly 100 generally, and more particularly as an environmental shield for at least a portion of the photovoltaic cell layer 110. The barrier layer 122 is preferably constructed of a transparent or translucent material that allows light energy to pass through to the photoactive portion of the photovoltaic cell layer 110. This material may be flexible (e.g. a thin polymeric film, a multi-layer film, glass, or glass composite) or be rigid (e.g. a thick glass or Plexiglas such as polycarbonate). The material may also be characterized by being resistant to moisture/particle penetration or build up. The barrier layer 122 may also function to filter certain wavelengths of light such that unpreferred wavelengths may not reach the photovoltaic cells. In a preferred embodiment, the barrier layer 122 material will also range in thickness from about 0.05 mm to 10.0 mm, more preferably from about 0.1 mm to 4.0 mm, and most preferably from 2.5 mm to 3.5 mm. Other physical characteristics, at least in the case of a film, may include: a tensile strength of greater than 20 MPa (as measured by JIS K7127); tensile elongation of 1% or greater (as measured by JIS K7127); and/or a water absorption (23° C., 24 hours) of 0.05% or less (as measured per ASTM D570); and/or a coefficient of linear expansion ("CLTE") of about $5 \times 10-6$ mm/mm° C. to $100 \times 10-6$ mm/mm° C., more preferably of about $10 \times 10-6$ mm/mm° C. to $80 \times 10-6$ mm/mm° C., and most preferably from about $20 \times 10-6$ mm/mm° C. to $50 \times 10-6$ mm/mm° C. Other physical characteristics, at least in the case of a thick glass, may include: a coefficient of linear expansion ("CLTE") of about $5 \times 10-6$ mm/mm° C. to about $140 \times 10-6$ mm/mm° C., preferably of about $7 \times 10-6$ mm/mm° C. to about $50 \times 10-6$ m/mm° C., more preferably from about $8 \times 10-6$ mm/mm° C. to about $30 \times 10-6$ mm/mm° C., and most preferably from about $9 \times 10-6$ mm/mm° C. to about $15 \times 10-6$ mm/mm° C. Other physical characteristics, at least in the case of a thick glass, may include: a density of about 2.42 g/cm$^3$ to about 2.52 g/cm$^3$, a tensile strength of between about 75 to 200 N/sq.mm, a compressive strength of between 500 and 1200 N/sq.mm, a modulus of elasticity of between 60-80 GPa, a CLTE of about $9 \times 10-6$ mm/mm° C., and a visible light transmission of at least about 85%, preferably about at least 87%, more preferably at least about 90%.

First Encapsulant Layer 124

In one example of an encapsulant layer, a first encapsulant layer 124 may be disposed below the barrier layer 122 and generally above the photovoltaic cell layer 110. It is contemplated that the first encapsulant layer 124 may serve as a bonding mechanism, helping hold the adjacent layers together. If should also allow the transmission of a desirous amount and type of light energy to reach the photovoltaic cell 110. The first encapsulant layer 124 may also function to compensate for irregularities in geometry of the adjoining layers or translated through those layers (e.g. thickness changes). It also may serve to allow flexure and movement between layers due to temperature change and physical movement and bending. In a preferred embodiment, first encapsulant layer 124 may consist essentially of an adhesive film or mesh, preferably an EVA (ethylene-vinyl-acetate), thermoplastic polyolefin, polyurethanes, ionomers, silicon based polymers or similar material. The preferred thickness of this layer range from about 0.1 mm to 1.0 mm, more preferably from about 0.2 mm to 0.8 mm, and most preferably from about 0.25 mm to 0.5 mm.

Photovoltaic Cell Layer 110

The photovoltaic cell layer 110 contemplated in the present invention may be constructed of any number of known photovoltaic cells commercially available or may be selected from some future developed photovoltaic cells. These cells function to translate light energy into electricity. The photoactive portion of the photovoltaic cell is the material which converts light energy to electrical energy. Any material known to provide that function may be used including crystalline silicon, amorphous silicon, CdTe, GaAs, dye-sensitized solar cells (so-called Gratezel cells), organic/polymer solar cells, or any other material that converts sunlight into electricity via the photoelectric effect. However, the photoactive layer is preferably a layer of IB-IIIA-chalcogenide, such as IB-IIIA-selenides, IB-IIIA-sulfides, or IB-IIIA-selenide sulfides. More specific examples include copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGSS). These can also be represented by the formula CuIn(1−x)GaxSe(2−y)Sy where x is 0 to 1 and y is 0 to 2. The copper indium selenides and copper indium gallium selenides are preferred. Additional electroactive layers such as one or more of emitter (buffer) layers, conductive layers (e.g. transparent conductive layers) and the like as is known in the art to be useful in CIGSS based cells are also contemplated herein. These ceils may be flexible or rigid and come in a variety of shapes and sizes, but generally are fragile and subject to environmental degradation. In a preferred embodiment, the photovoltaic cell assembly 110 is a cell that can bend without substantial cracking and/or without significant loss of functionality. Exemplary photovoltaic cells are taught and described in a number of US patents and publications, including U.S. Pat. No. 3,787,471, U.S. Pat. No. 4,465,575, US20050011550 A1, EP841706 A2, US20070256734 a1, EP1032051A2, JP2216874, JP2143468, and JP10189924a, incorporated hereto by reference for all purposes.

The photovoltaic cell layer 110, for example as illustrated in FIG. 2B, may also include electrical circuitry, such as buss bar(s) 111 that are electrically connected to the cells, the connector assembly component(s) 300 and generally run from side to side of the PV sheathing element 10. This area may be known as the buss bar region 311.

Second Encapsulant Layer 128

In another example of an encapsulant layer, a second encapsulant layer 126 is generally connectively located below the photovoltaic cell layer 110, although in some instances, it may directly contact the top layer 122 and/or the first encapsulant layer 124. It is contemplated that the second encapsulant layer 126 may serve a similar function as the first encapsulant layer, although if does not necessarily need to transmit electromagnetic radiation or light energy.

Back Sheet 128

In an example of a protective layer there may be a back sheet 128 which is connectively located below the second encapsulant layer 120. The back sheet 128 may serve as an environmental protection layer (e.g. to keep out moisture and/or particulate matter from the layers above). It is preferably constructed of a flexible material (e.g. a thin polymeric film, a metal foil, a multi-layer film, or a rubber sheet). In a preferred embodiment, the back sheet 128 material may be moisture impermeable and also range in thickness from about 0.05 mm to 10.0 mm, more preferably from about 0.1 mm to 4.0 mm, and most preferably from about 0.2 mm to 0.8 mm. Other physical characteristics may include: elongation at break of about 20% or greater (as measured by ASTM D882); tensile strength or about 25 MPa or greater (as measured by ASTM D882); and tear strength of about 70 kN/m or greater (as measured with the Graves Method). Examples of preferred materials include: glass plate; aluminum foil; poly (vinyl fluoride) (for example, commercially available as Tedlar® (a trademark of DuPont)); poly (ethylene terephthalate); copolymer of tetrafluoroethylene and hexafluoroethylene (also known as "FEP"); poly (ethylene tetrafluoroethylene); poly (ethylene naphthalate); poly (methyl methacrylate): and polycarbonate, or a combination thereof.

Supplemental Barrier Sheet 130

In another example of a protective layer there may be a supplemental barrier sheet 130 which is connectively located below the back sheet 128. The supplemental barrier sheet 130 may act as a barrier, protecting the layers above from environmental conditions and from physical damage that may be caused by any features of the structure on which the PV sheathing element 10 is subjected to (e.g. For example, irregularities in a roof deck, protruding objects or the like). It is contemplated that this is an optional layer and may not be required. It is also contemplated that this layer may serve the same functions as the body portion 200. In a preferred embodiment, the supplemental barrier sheet 130 material may be at least partially moisture impermeable and also range in thickness from about 0.25 mm to 10.0 mm, more preferably from about 0.5 mm to 2.0 mm, and most preferably from 0.8 mm to 1.2 mm. It is preferred that this layer exhibit elongation at break of about 20% or greater (as measured by ASTM D882); tensile strength or about 10 MPa or greater (as measured by ASTM D882); and tear strength of about 35 kN/m or greater (as measured with the Graves Method). Examples of preferred materials include thermoplastic polyolefin ("TPO"), thermoplastic elastomer, olefin block copolymers ("OBC"), natural rubbers, synthetic rubbers, polyvinyl chloride, and other elastomeric and plastomeric materials. Alternately the protective layer could be comprised of more rigid materials so as to provide additional roofing function under structural and environmental (e.g. wind) loadings. Additional rigidity may also be desirable so as to improve the coefficient of thermal expansion of the PV sheathing element 10 and maintain the desired dimensions during temperature fluctuations. Examples of protective layer materials for structural properties include polymeric materials such polyolefins, polyesters, polyamides, polyimides, polyester amides, polysulfone, acetal, acrylic, polyvinyl chloride, nylon, polycarbonate, phenolic, polyetheretherketone, polyethylene terephthalate, epoxies, including glass and mineral filled composites or any combination thereof.

The above described layers may be configured or slacked in a number of combinations, but if is preferred that the barrier layer 122 is the top layer. Additionally, it is contemplated that these layers may be integrally joined together via any number of methods, including but not limited to; adhesive joining: heat or vibration welding; over-molding; or mechanical fasteners.

For the sake of clarity in view of some of the embodiments discussed below, the photovoltaic cell assembly 100 can be further described in another fashion, as a two part assembly. The first part, the photovoltaic cell assembly subassembly 101, comprising all the layers of the photovoltaic cell assembly 100 (with the exception of the barrier layer 122) and the second part being the barrier layer 122. The barrier layer 122 may also be described as having a length "$L_{BL}$" and a width "$W_{BL}$", for example as labeled in FIG. 2A. Preferably, the $L_{BL}$ ranges from about 0.75 to about 1.25 times that of the $L_{BP}$ discussed below, more preferably the lengths are within about 5-10% of each other. Also contemplated is that the photovoltaic cell assembly subassembly 101 may have an overall CLTE ("subassembly CLTE") that ranges from about 30×10−6 mm/mm° C. to 150×10−6 mm/mm° C.; more preferably about 50×10−6 mm/mm° C. to 100×10−6 mm/mm° C.

Body Portion 200

It is contemplated that the body portion 200 may be a compilation of components/assemblies, but is preferably generally a polymeric article that is formed by injecting a polymer (or polymer blend) into a mold (with or without inserts such as the photovoltaic cell assembly 100 or the other component(s) (e.g. connector component)—discussed later in the application), for example as disclosed in currently pending International patent application No. PCT/US09/042496, incorporated herein by reference. The body portion 200 functions as the main structural carrier for the PV sheathing element 10 and should be constructed in a manner consistent with this function. For example, it can essentially function as a plastic framing material. It is contemplated that the body portion 200 should adhere to photovoltaic cell assembly 100 with an adhesion strength no less than the stress due to thermal expansion.

It is contemplated that the compositions that make up the body portion 200 also exhibit a coefficient of linear thermal expansion ("CLTE") of about 0.5×10−6 mm/mm° C. to about 140×10−6 mm/mm° C., preferably of about 3×10−6 mm/mm° C. to about 50×10 −6 mm/mm° C., more preferably from about 5×10−6 mm/mm° C. to about 30×10 −6 mm/mm° C., and most preferably from about 7×10−6 mm/mm° C. to about 15×10 −6 mm/mm° C. Most desirably, the CLTE of the composition that makes up the body portion 200 should closely match the CLTE of the barrier layer 122. Preferably the CLTE of the composition making up the body portion 200 disclosed herein are also characterized by a coefficient of linear thermal expansion (CLTE) is within factor of 20, more preferably within a factor of 15, still more preferably within a factor of 10, even more preferably within a factor of 5, and most preferably within a factor of 2 of the CLTE of the barrier layer 122. Matching the CLTE's between the composition comprising the body portion 200 and the barrier layer 122 is important for minimizing thermally-induced stresses on the BIPV device during temperature changes, which can potentially result in cracking, breaking of PV cells, etc.

For some embodiments of the photovoltaic articles disclosed herein, the barrier layer 122 includes a glass barrier layer. If the barrier layer 122 includes a glass layer, the CLTE of the molding composition is preferably less than 80×10−6 mm/mm° C., more preferably less than 70×10−6 mm/mm° C., still more preferably less than 50×10−6 mm/mm° C., and most preferably less than 30×10−6 mm/mm° C. Preferably, the CLTE of the novel composition is greater than 5×10−6 mm/mm° C.

When glass is used (as the barrier layer 122), the compositions of the body material preferably have an elongation at break of at least 3% but not typically more than 200%. It is also contemplated, when glass is not used, that the body material preferably has an elongation at break of at least 100%, more preferably at least 200%, more preferably still at least 300% and preferably no more than 500%. The tensile elongation at break of compositions were determined by test method ASTM D638-08 (2008) @23° C. using a test speed of 50 mm/min.

In a preferred embodiment, the body support portion 200 may comprise (be substantially constructed from) a body material. This body material may be a filled or unfilled moldable plastic (e.g. polyolefins, acrylonitrile butadiene styrene (SAN), hydrogenated styrene butadiene rubbers, polyesters, polyamides, polyester amides, polyether imide, polyimides, polysulfone, acetal, acrylic, polyvinyl chloride, nylon, polyethylene terephthalate, polycarbonate, thermoplastic and thermoset polyurethanes, synthetic and natural rubbers, epoxies, SAN, Acrylic, polystyrene, or any combination thereof). Fillers (preferably up to about 50% by weight) may include one or more of the following: colorants, fire retardant (FR) or ignition resistant (IR) materials, reinforcing materials, such as glass or mineral fibers, surface modifiers. Plastic may also include antioxidants, release agents, blowing agents, and other common plastic additives. In a preferred embodiment, glass fiber filler is used. The glass fiber preferably has a fiber length (after molding) ranging from about 0.1 mm to about 2.5 mm with an average glass length ranging from about 0.7 mm to 1.2 mm.

In a preferred embodiment, the body material (composition(s)) has a melt flow rate of at least 5 g/10 minutes, more preferably at least 10 g/10 minutes. The melt flow rate is preferably less than 100 g/10 minutes, more preferably less than 50 g/10 minutes and most preferably less than 30 g/10 minutes. The melt flow rate of compositions were determined by test method ASTM D1238-04, "REV C Standard Test Method for Melt Flow Rates of Thermoplastics by Extrusion Plastometer", 2004 Condition L (230° C./2.16 Kg). Polypropylene resins used in this application also use this same test method and condition. The melt flow rate of polyethylene and ethylene—α-olefin copolymers in this invention are measured using Condition E (190° C./2.16 Kg), commonly referred to as the melt index.

In all embodiments, the compositions have flexural modulus of at least 200 MPa, more preferably at least 400 MPa and most preferably at least 700 MPa. According to the preferred embodiment where the photovoltaic cell assembly 100 includes a glass layer, the flexural modulus is preferably at least 1000 and no greater than 7000 MPa. According to the second embodiment, the flexural modulus is no greater than 1500 MPa, more preferably no greater than 1200 MPa, most preferably no greater than 1000 MPa. The flexural modulus of compositions were determined by test method ASTM D790-07 (2007) using a test speed of 2 mm/min. It is contemplated that the compositions that make up the body portion 200 also exhibit a coefficient of linear thermal expansion ("body CLTE") of about 25×10−6 mm/mm° C. to 70×10−6 mm/mm° C., more preferably of about 27×10−6 mm/mm° C. to 60×10−6 mm/mm° C. and most preferably from about 30×10−6 mm/mm° C. to 40×10−6 mm/mm° C.

It is contemplated that the body portion 200 may be any number of shapes and sizes. For example, it may be square, rectangular, triangular, oval, circular or any combination thereof. The body portion 200 may also be described as having a length "$L_{BP}$" and a width "$W_{BP}$" for example as labeled in FIG. 2 and may be as little as 10 cm and as much as 500 cm or more, respectively. It may also have a thickness (t) that may range from as little as about 1 mm to as much as 20 mm or more and may vary in different area of the body portion 200. Preferably, the body portion 200 can be described as having a body lower surface portion 202, body upper surface portion 204 and a body side surface portion 206 spanning between the upper and lower surface portions and forming a body peripheral edge 208. The body portion 200 may also have a transition portion 210 that is in the form of a protuberance at a portion of the interface between the photovoltaic cell assembly 100 and the body portion 200 (on the body lower surface portion 202) as illustrated in FIG. 5.

Geometric Features 250

If is contemplated that the body portion 200 may also include one or more geometric features 250. These features 250 may function to prevent vertically adjoining sheathing elements 10 from sliding relative to each other prior to final attachment, for example preventing the PV sheathing element 10 from falling off the roof during installation. It is contemplated that these features 250 should have the above stated function, while at the same time not interfering with the basic function of the sheathing element 10 or with the ability of the Installer to easily install the sheathing elements 10 into an array 1000. It is contemplated that the geometric features protrude from the body lower surface portion 202, body upper surface portion 204, or both. It is also desirable that the features not interfere with the sheathing elements 10 ability to lay relatively flat when fastened to a structure. It is preferred that whatever combination of features 250 are utilized, the features are capable of being "flattened out" or made not to effect the above mentioned functions. It is even more preferred that the force required to "flatten out" the features 250 be at least greater than the force exerted by the mass of the sheathing element 10 if laid on a flat surface and no more than a force required to install the sheathing element 10. In one exemplary embodiment, the force required to "flatten out" the features 250 may be as low as about 5 Newtons ("N") and as high as about 200 Newtons. In a preferred embodiment, the force is greater that about 5N, more preferably is greater than about 7N, even more preferably greater than about 10N, and preferably less than about 200N, more preferably less than about 100N and most preferably less than about 50N.

It is contemplated that the features 250 may be disposed on the body lower surface portion 202, body upper surface portion 204, or both. It is also contemplated that the features 250 may include localized areas that are weakened so that a natural hinge point is created. This may be accomplished in any number of ways which form a natural hinge point, including but not limited to, thinned out cross sections at or near the base of the feature. Below, a few illustrative examples and preferred embodiments are described in further detail.

Figure 5A:
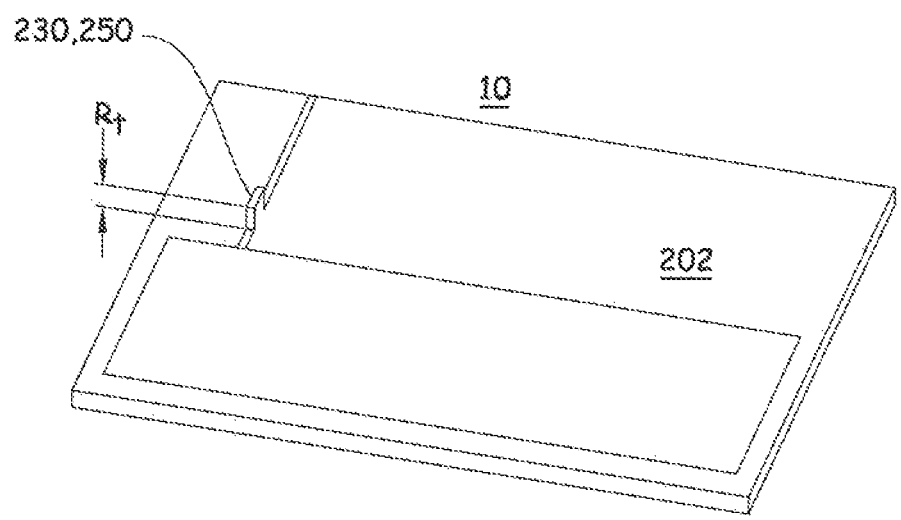
FIG. 5A is a perspective view of one example a geometric feature of one embodiment according to the present invention.
Figure 5B:
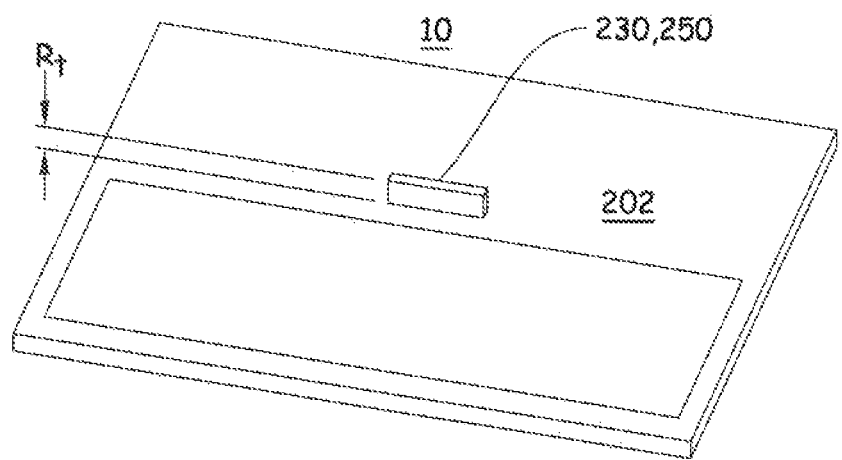
FIG. 5B is a perspective view of an example a geometric feature of on (c) embodiment according to the present invention.
Figure 5C:
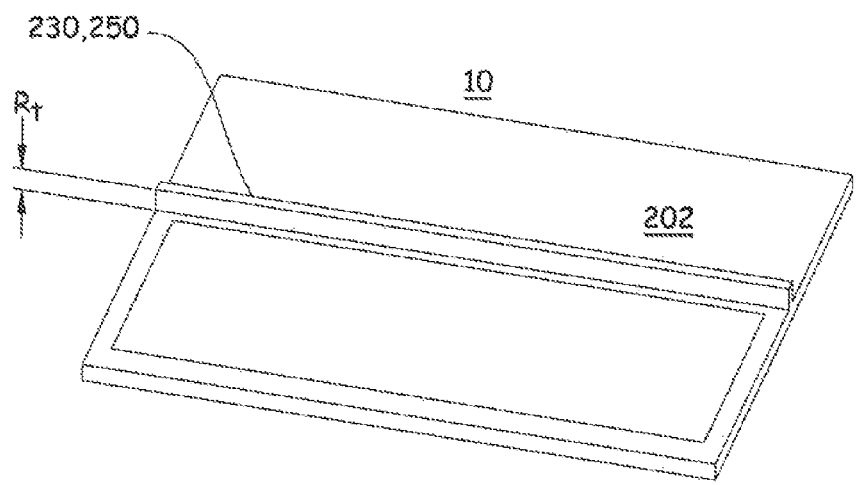
FIG. 5C is a perspective view of an example a geometric feature of one embodiment according to the present invention.

In a first embodiment, the feature 250 is located on the body lower surface portion 202. It is contemplated that this feature is in the form of one or more extended ledge ribs 230. The rib 230 may be located on body lower surface portion 202: and is capable of engaging a top peripheral edge (e.g. the body peripheral edge 208) of vertically adjoining device, for example as illustrated in FIGS. 5A-C. It is contemplated that the tab may run fore-aft on the sheathing element (e.g. FIG. 5A) or across the sheathing element 10 (e.g. FIGS. 5B-C). In one preferred embodiment, the rib 230 is about 10 mm or greater in length ($R_T$) and is about 35 mm or less. In another preferred embodiment, the rib 230 spans substantially across the sheathing element 10. It is contemplated that if the rib is too long or too short, it may not conform to the force criteria discussed above or may not engage the top peripheral edge of vertically adjoining device properly. FIG. 5A shows a photovoltaic sheathing element 10, having geometric feature 250 in the form of a protrusion 230 located on the body lower surface portion 202 of the photovoltaic sheathing element 10. FIG. 5B shows geometric feature 250 in the form of a protrusion 230 disposed on the body lower surface portion 202 of the photovoltaic sheathing element 10. The protrusion rib length (Rt) of the protrusion is illustrated. FIG. 5C shows a photovoltaic sheathing element 10, having geometric feature 250 in the form of a protrusion 230 which spans the width of the photovoltaic sheathing element, to in essence from a protruding rib, located on the body lower surface portion 202 of the photovoltaic sheathing element 10.

In a second embodiment, the feature 250 is located on one or more top peripheral tabs 600. Generally, a top peripheral tab 600 may be generally defined as a localized extension of the body section 200, for example as shown in FIG. 1.

Figure 6A:
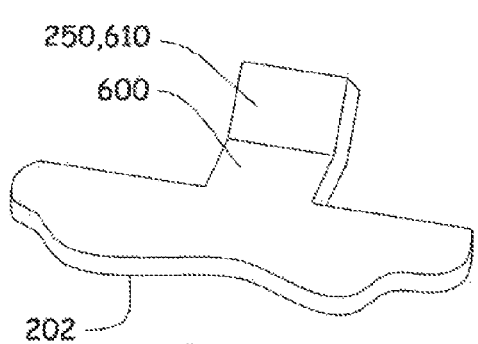
FIG. 6A is a perspective view of one example a geometric feature of an embodiment according to the present invention.
Figure 6B:
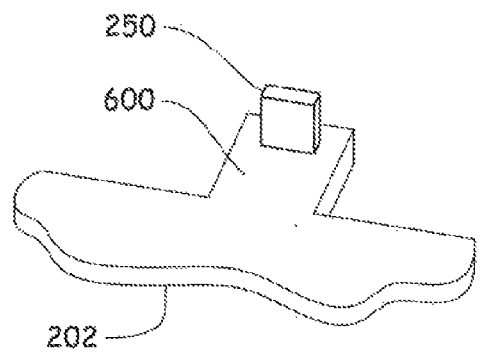
FIG. 6B is a perspective view of another example a geometric feature of another embodiment according to the present invention.
Figure 6C:
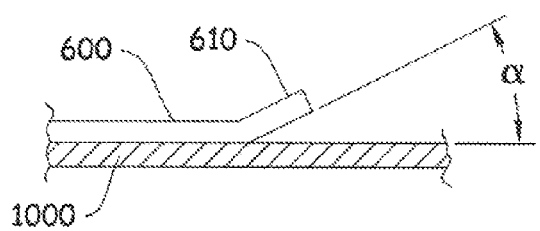
FIG. 6C is a side view showing a building structure and angle α.
Figure 6D:
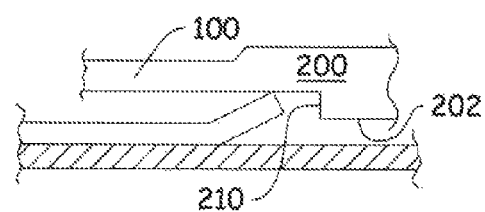
FIG. 6D is a partial side view of an exemplary geometric feature and its interface with a vertically adjoining device.

In one illustrative example, the tab 600 itself may be the feature 250, for example as shown in FIGS. 6A, 6C and 6D. In another illustrative example, the tab 600 provides a base for the feature 230, for example as shown in FIG. 6B.

In a preferred embodiment related to the first illustrative example, the tab 600 itself constitutes the feature 250 and the tabs including an upwardly extending portion 610. Even more preferably, the upwardly extending portion 610 begins at least 10 mm from a distal end of tabs 600 and has an angle α of preferably about 80° or less, more preferably about 60° or less, more preferably about 50° or less, and preferably about 5° or greater, more preferably about 10° or less relative to a plane defined by a mounting surface of the building structure, as shown in FIG. 6C. For example, this angle could be very small. For example, 10 mm distance can be achieved in a 80 mm tab with an angle α of 9.5 degrees. In this embodiment, it is contemplated that the feature 250 is capable of engaging a vertically adjacent device (e.g. sheathing element 10) at the transition portion 210, for example as shown in FIG. 6D.

Pre-Bend

Figure 7:
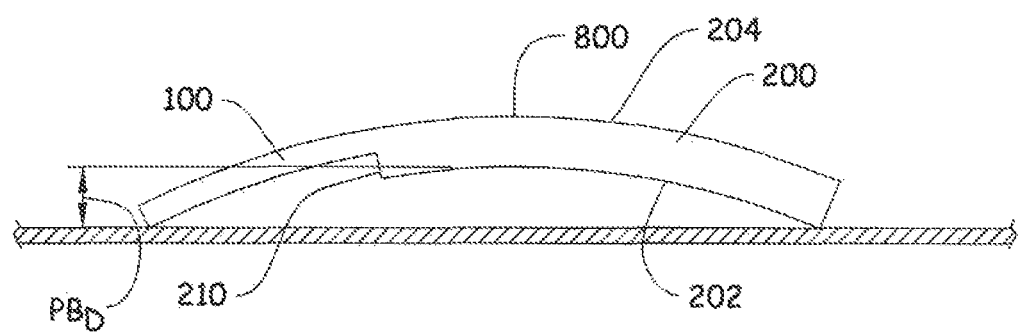
FIG. 7 is a side view of an exemplary sheathing element showing the pre-bend.

It is contemplated that the sheathing element 10 may have a pre-bend or "cant" formed into the structure, as illustrated in FIG. 7. It is believed that having a pre-bend in the sheathing element may provide better environmental stability for the part when installed on the building structure 1100 (e.g. resistance to wind uplift) as well as possibly other issues described previously in the application. Preferably, the photovoltaic building sheathing element includes a pre-bend, the pre-bend including a vertical bend distance of about 3 to about 35 mm as measured under a fixation area and normal to the building structure. The pre-bend of the sheathing element 10 is preferably arcuate in shape and may be substantially removed (e.g. flattened out) when installed on the building structure, it is preferred that no matter how much pre-bend exists in the sheathing element 10, the force required to remove bend is consistent with nailing or screwing or other attachment means (e.g. clips) or to say bend is substantially reduced or removed as installed and according to one embodiment the bend is preferably removed in the non-PV cell portion or non-active portion. In other words, it is preferred that the pre-bend exists for the most part in the area of the sheathing element 10 that would not suffer damage if it were bent. The apex can be located anywhere along the PV sheathing element so that the PV sheathing element remains on the structure unit being affixed to the structure. In one embodiment, the prebend is designed such that prior to affixing the PV sheathing element to the structure the concave surface of the photovoltaic sheathing element faces the surface of the structure it is to be affixed to. For simplicity, the pre-bend may be further defined as a vertical bend distance ($PB_D$) between a flat surface and the bottom of the sheathing element 10 at the fixation area 800. In a preferred embodiment, the amount of pre-bend (vertical bend distance ($PB_D$)) may range from about a minimum of about 3 mm to a maximum of about 35 mm. In a preferred embodiment, the vertical bend distance is about 3 mm or greater, more preferably at least about 6 mm or greater, and most preferably at least about 10 mm or greater, and the bend distance is about 35 mm or less, more preferably at most about 30 mm or less, and most preferably at most about 25 mm or less. It is contemplated that the portion of the sheathing element that flexes during the installation as the pre-bend is flattened out during installation is preferably in the upper body portion 200, most preferably above the nail locations. This is preferable so as to minimize the stress in the photovoltaic region 100.

Fixation Area 800

A fixation area 800 is an area of the PV sheathing element 10 where it is desirable through which to secure (e.g. via fasteners such as nails, screws, dips, etc.) the sheathing element 10 to the building structure. The area. 800 is preferably positively identified on the PV sheathing element 10 such that an installer may easily ascertain the proper area in which to drive the nail, screw, or other fasteners. As shown in FIG. 1, in one illustrative example, a plurality of semi-circles and text identify the preferred fixation area 800.

Connector Assembly 300

The connector assembly generally functions to allow for electrical communication to and/or from the PV sheathing element 10. This communication may be in conjunction with circuitry connected to the photovoltaic cell layer 110 or may just facilitate communication through and across the PV sheathing element 10 via other circuitry. The connector assembly may be constructed of various components and assemblies, and may be partially or fully integral to (embedded within) the PV sheathing element 10, it may include both rigid and flexible portions. The assembly 300 may or may not require use with a separate component (e.g. see bridging connectors 330) to facilitate the electrical communication, illustrative examples/embodiments of possible configurations are shown in the drawing figures and discussed in the subsequent paragraphs.

Preferably the connecter assembly 300 comprises at least a polymer based housing 310 and electrical leads 320 protruding outward from the housing and generally embedded in the PV sheathing element 10, although other configurations are contemplated. It is contemplated that the housing 310 can be adapted to either receive a mating connector or to be received into a mating connector.

Array of Devices 1000

An array of devices (e.g. PV sheathing elements 10; spacer devices "S", edge pieces "E" etc) function to provide electrical energy when subjected to solar radiation (e.g. sunlight). An array is a collection of interconnected devices as installed on a building structure 1100. For the purposes of this invention, it is contemplated that the array 1000 is installed directly on an existing roof deck (or exterior surface) of a building structure 1100, or over a previously installed roofing material (e.g. asphalt sheathing elements), in the same way traditional rooting sheathing elements are applied (unless otherwise noted herein). These arrays 1000 may be made up of two or more rows of adjoining devices, the rows containing at least two or more devices themselves. As an illustrative example, a shown in FIG. 3, the array 1000 presented has 4 rows, with 3 devices per row and snared edge pieces on each end (PV sheathing element 10, edge piece "E", spacer device "S"). An edge piece "E" generally functions to connect multiple rows of devices together, and may or may not include other functional elements. A spacer device "S" generally may function to connect devices within a row, and may or may not include other functional elements.

It is contemplated that the embodiments or examples described above may not be mutually exclusive and may be used in combination with each other.

Unless stated otherwise, dimensions and geometries of the various structures, depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

Unless otherwise stated, the coefficient of linear expansion ("CLTE") for the materials and assemblies disclosed herein is determined on a TA instruments TMA Model 2940 by test method ASTM E1824-08 (2008) in a temperature range of −40° C. and 90° C., at 5° C. per minute, using the standard software provided with the instrument. The skilled artisan will appreciate that a composition may exhibit temperature ranges where the CLTE changes from other regions as the material undergoes thermal transitions. In such a case, the preferred ranges for CLTE above refer to the largest measured CLTE for the compositions, assemblies and/or barrier layer 122. A photovoltaic device may include many different materials, including materials with very different CLTE. For example, a PV assembly may include solar cells, metal conductors, polymeric encapsulants, barrier materials such as glass, or other disparate materials, all with different CLTE's. The CLTE of a PV assembly may be determined by measuring the dimensions of the assembly at a number of temperatures between −40° C. and 90° C. This temperature range is also assumed for ail other physical properties (testing) unless otherwise specified.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner. Unless otherwise stated, all ranges include both endpoints and ail numbers between the endpoints. The use of "about" or "approximately" in connection with a range applies to both ends of the range. Thus, "about 20 to 30" is intended to cover "about 20 to about 30", inclusive of at least the specified endpoints. The disclosures of ail articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination. The use of the terms "comprising" or "including" describing combinations of elements, ingredients, components or steps herein also contemplates embodiments that consist essentially of the elements, ingredients, components or steps. Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe art element, ingredient, component or step is not intended to foreclose additional elements, ingredients, components or steps.

What is claimed is:

1. An assembly comprising:
   a photovoltaic building sheathing element capable of being affixed on a building structure, the photovoltaic building sheathing element comprising:
      a photovoltaic cell assembly including at least a first and a second connector assembly capable of directly or indirectly electrically connecting the photovoltaic cell assembly to one or more adjoining devices;
      a body portion attached to one or more portions of the photovoltaic cell assembly wherein the body portion comprises a filled or unfilled plastic having a flexural modulus of 200 MPa to 7000 MPa, the body portion having:
         a body lower surface portion,
         a body upper surface portion, and
         a body side surface portion spanning between the body lower surface portion and the body upper surface portion; and
   wherein the body portion includes one or more geometric features protruding from the body portion, the geometric features being adapted to engage a vertically adjoining device before installation and each of the one or more geometric features is capable of being flattened out; and
   wherein the one or more geometric features comprise one or more extended ledge ribs disposed on the body lower surface portion, the extended ledge ribs capable of engaging a top peripheral edge of the vertically adjoining device.

2. The assembly according to claim 1, wherein the photovoltaic building sheathing element includes a pre-bend, the pre-bend including a vertical bend distance of 3 to 35 mm as measured under a fixation area and normal to the building structure.

3. The assembly according to claim 1, wherein the one or more geometric features comprise one or more top peripheral tabs including a base and an upwardly extending portion that is connected to and extends at an angle from the base, and the upwardly extending portion being capable of being flattened out.

4. The assembly according to claim 3, wherein the upwardly extending portion begins 10 mm or greater from a distal end of the one or more top peripheral tabs and has an angle of 5 to 80 degrees relative to a plane defined by a mounting surface of the building structure.

5. The assembly according to claim 3, wherein the upwardly extending portion extends from an upper surface of the one or more top peripheral tabs.

6. The assembly according to claim 3, wherein the upwardly extending portion is capable of being flattened out with the exertion of a force of 7 Newtons or greater applied normal to a distal end of the upwardly extending portion.

7. The assembly according to claim 1, wherein the one or more extended ledge ribs is capable of being flattened out with the exertion of a force of 7 Newtons or greater applied normal to a distal end of the one or more extended ledge ribs.

8. The assembly according to claim 1, wherein the at least first and second connector assemblies are disposed on opposite sides of the photovoltaic building sheathing element and are capable of directly or indirectly electrically connecting the photovoltaic cell assembly to one or more horizontally adjoining devices.

9. An array of assemblies comprising:
at least two or more assemblies according to claim 1.

10. The assembly according to claim 2, wherein the body lower surface portion of the body portion comprises a transition portion in the form of a protuberance at a portion of the interface between the photovoltaic assembly and the body portion.

11. The assembly according to claim 7, wherein the one or more geometric features is capable of engaging a vertically adjacent device at a transition portion.

12. The assembly according to claim 3, wherein the one or more geometric features includes a localized area that is weakened to create a natural hinge point.

13. The assembly according to claim 2, wherein the sheathing element having a pre-bend is capable of being flattened out with the exertion of a force capable of affixing the sheathing element to a building structure.

14. The assembly of claim 1, wherein the filled or unfilled plastic of the body portion exhibits a flexural modulus of 200 MPa to 1500 MPa.

15. The assembly of claim 3, wherein a natural hinge is located between and connects each of the upwardly extending portions to each of the one or more top peripheral tabs and the upwardly extending portions are flattened out so that the upwardly extending portions moves about the natural hinge.

16. The assembly according to claim 3, wherein the at least first and second connector assemblies are disposed on opposite sides of the photovoltaic building sheathing element and are capable of directly or indirectly electrically connecting the photovoltaic cell assembly to one or more horizontally adjoining devices.

17. The assembly of claim 10, wherein the transition portion is located on a bottom side of the body portion and the photovoltaic assembly extends above the transition portion.

18. The assembly of claim 1, wherein the one or more adjoining devices are one or more adjacent photovoltaic building sheathing elements.

19. The assembly of claim 15, wherein the upwardly extending portion forms an angle of about 5 degrees or greater with a plane defined by a mounting surface of the building structure.

* * * * *